(12) United States Patent
Hung et al.

(10) Patent No.: US 9,009,639 B2
(45) Date of Patent: Apr. 14, 2015

(54) METHOD AND SYSTEM FOR ENHANCED INTEGRATED CIRCUIT LAYOUT

(71) Applicant: Taiwan Semiconductor Manufacturing Company, Ltd., Hsin-Chu (TW)

(72) Inventors: Wei-Chiang Hung, Changhua (TW); Song-Bor Lee, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/941,196

(22) Filed: Jul. 12, 2013

(65) Prior Publication Data
US 2015/0020041 A1    Jan. 15, 2015

(51) Int. Cl.
*G06F 17/50*    (2006.01)

(52) U.S. Cl.
CPC ........ *G06F 17/5072* (2013.01); *G06F 17/5081* (2013.01)

(58) Field of Classification Search
CPC .................................. G06F 17/30; G06F 17/50
USPC ............................................................ 716/112
See application file for complete search history.

(56) References Cited

U.S. PATENT DOCUMENTS

2009/0326873 A1* 12/2009 Wang et al. ........................ 703/1
2013/0175631 A1*  7/2013 Behrends et al. ............. 257/368

* cited by examiner

*Primary Examiner* — Vuthe Siek
*Assistant Examiner* — Mohammed Alam
(74) *Attorney, Agent, or Firm* — Haynes and Boone, LLP (57) ABSTRACT

An integrated circuit (IC) design method includes providing a design layout of the IC and placing a first cell and a second cell into the design layout. The second cell is a mirror of the first cell. The method further includes dividing the first cell into a first plurality of segments and dividing the second cell into a second plurality of segments. A third cell is formed by connecting a first portion of the first plurality of segments with a first portion of the second plurality of segments. A fourth cell is formed by connecting a second portion of the first plurality of segments with a second portion of the second plurality of segments. The first, second, third and fourth cells each have substantially the same function.

20 Claims, 7 Drawing Sheets

METHOD AND SYSTEM FOR ENHANCED INTEGRATED CIRCUIT LAYOUT

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Another aspect of the IC evolution involves increased IC design complexity and shortened time-to-market. Designers generally face a demanding project schedule from IC conception to IC production. To meet these challenges, designers generally use modular design and hierarchical design approaches, aided by design automation tools, such as Computer Aided Design (CAD) tools. For example, a cell is designed to include multiple components, such as resistors, capacitors, and transistors, interconnected to achieve certain functionality. Then, the cell, as a unit, is replicated and placed in different parts of a design where the same functionality is needed.

In some IC designs, matching of certain characteristics of two cells is critical for the circuit performance and an offset between them may present issues. The offset between the two cells may be directed to a relative difference between two cells. Alternatively, the offset may be directed to an absolute difference between the cells. Moreover, characteristics of a semiconductor component are generally affected by its surrounding components in a design layout, such as pattern density uniformity, as well as manufacturing processes, such as thermal related process, substrate uniformity, etc. Simply placing two replications of a cell into a design layout may not achieve a desirable matching effect.

Accordingly, what is needed is improvement in this area.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the performance of a first process (or operation) before a second process (or operation) in the description that follows may include embodiments in which the second process (or operation) is performed immediately after the first process (or operation), and may also include embodiments in which additional processes (or operations) may be performed between the first and second processes (or operations). Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1:
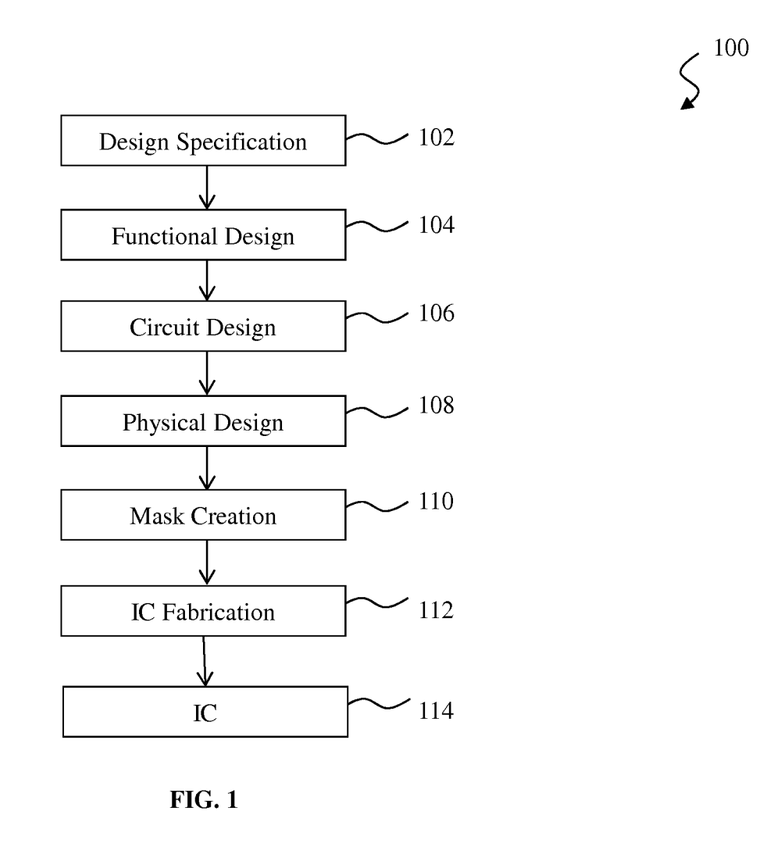
FIG. 1 is a simplified block diagram of an embodiment of an integrated circuit (IC) design and manufacturing flow.

FIG. 1 is a simplified block diagram of an embodiment of an integrated circuit (IC) design and manufacturing flow 100 to produce an IC 114. The IC design flow 100 typically starts with a design specification 102 which includes the design requirements of the IC 114. It then proceeds to functional design 104 where the design of the IC 114 is partitioned into a plurality of functional blocks and the plurality of functional blocks interact to produce the desired functionalities.

The IC design flow 100 then proceeds to circuit design 106. In one embodiment, the circuit design 106 uses a bottom-up hierarchical approach where a plurality of cells are built with elementary circuit components such as resistors, capacitor, and transistors, then more complex functional blocks are built with the plurality of cells as components. Various components within a cell are coupled to form desired functionality for the cell. One mechanism for the coupling is through interconnect, also called routing. Various Computer Aided Design (CAD) tools are available to capture the design of the cells, the design of the functional blocks, and the design of the IC into a computer readable file. In one embodiment, the IC design is described in Register Transfer Level (RTL) language such as Verilog or VHDL and then is synthesized into a netlist. In another embodiment, the IC design is described graphically in schematic using the aforementioned hierarchical approach.

After the IC design has been captured into a computer readable file, such as a netlist or a schematic, the IC design flow 100 proceeds to physical design 108 where an IC design layout is produced. The IC design layout includes various geometrical patterns designed for the IC 114. The geometrical patterns correspond to patterns of metal, oxide, or semiconductor layers that make up the various components of the IC device 114 to be fabricated. The various layers combine to form various IC features. For example, a portion of the IC design layout includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. The IC design layout is presented in one or more data files having information of the geometrical patterns. For example, the IC design layout can be expressed in a GDSII file format (or DFII file format). The physical design 108 includes various operations which will be described in greater details later in the document.

With the IC design layout, the IC design flow 100 proceeds to mask creation 110 to produce one or more masks to be used for fabricating the various layers of the IC product according to the IC design layout. The mask creation 110 includes various tasks such as mask data preparation, where the IC design layout is translated into a form that can be physically written by a mask writer, and mask fabrication, where the design layout prepared by the mask data preparation is modified to comply with a particular mask writer and/or mask manufacturer and is then fabricated. In one embodiment, the mask data preparation includes an optical proximity correction (OPC), and a lithography process check (LPC). The mask data preparation can include further resolution enhancement techniques (RET), such as off-axis illumination, sub-resolution assist features, phase-shifting masks, other suitable techniques, or combinations thereof.

The mask fabrication may use various technologies. In one embodiment, the mask is formed using binary technology. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM as known in the art.

After the mask (or masks) has been fabricated, the IC design flow proceeds to IC fabrication 112. The IC fabrication may be done by a myriad of manufacturing facilities. For example, there may be a manufacturing facility for the front end fabrication of a plurality of IC products (i.e., front-end-of-line (FEOL) fabrication), while a second manufacturing facility may provide the back end fabrication for the interconnection and packaging of the IC products (i.e., back-end-of-line (BEOL) fabrication), and a third manufacturing facility may provide other services for the foundry business.

In one embodiment, a semiconductor wafer is fabricated using the mask (or masks) to form the IC device 114. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The mask may be used in a variety of processes. For example, the mask may be used in an ion implantation process to form various doped regions in the semiconductor wafer, in an etching process to form various etching regions in the semiconductor wafer, and/or other suitable processes.

After being fabricated, the IC devices typically go through a packaging and testing process before being delivered to market.

Figure 2A:
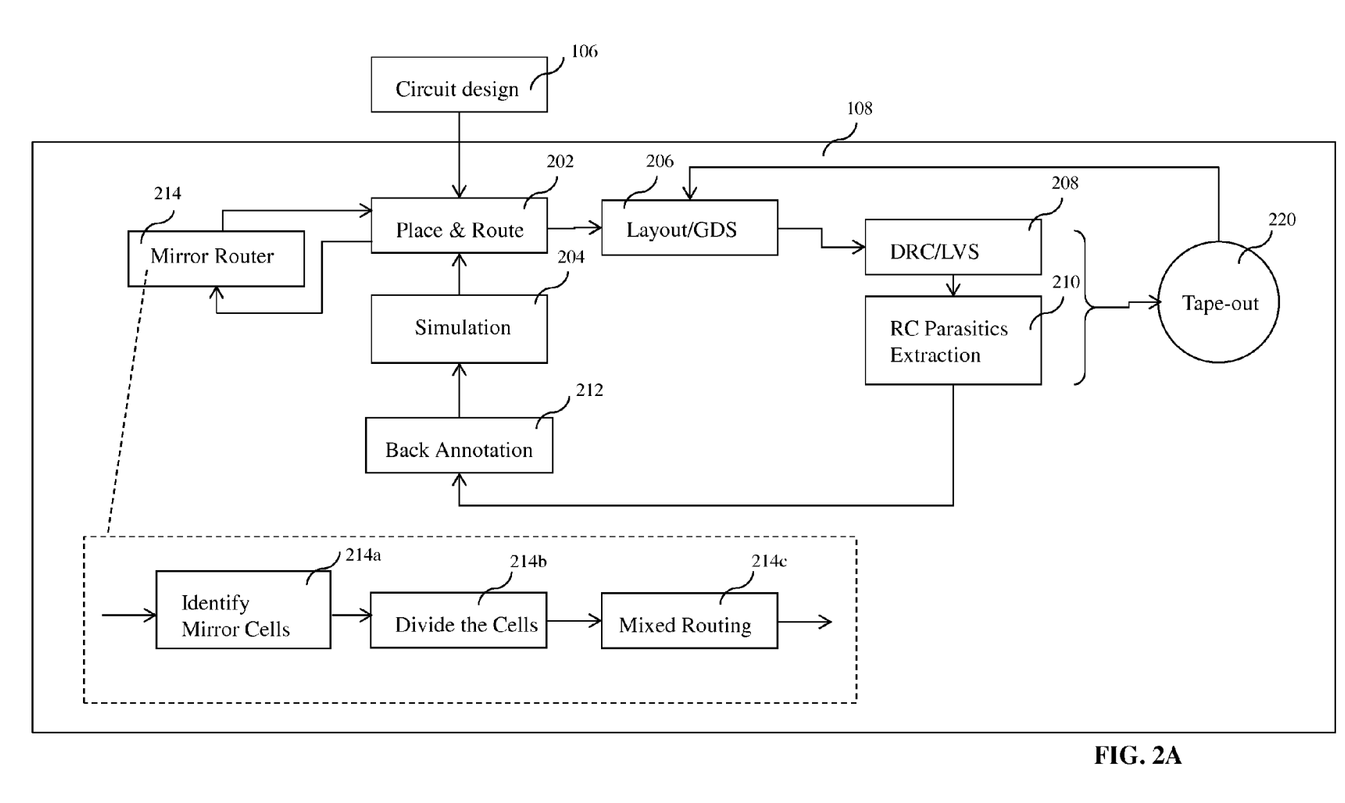
FIG. 2A is one embodiment of the IC physical design phase shown in FIG. 1 according to various aspects of the present disclosure.

FIG. 2A shows a more detailed block diagram of the physical design 108 shown in FIG. 1 according to various aspects of the present disclosure. The physical design 108 includes a place-and-route module 202. Standard cells, input/output (I/O) cells, and IP/Macro can be placed in various locations according to the functional connectivity and the optimization of signal routing. The IC device may include a plurality of pairs of cells where each pair needs to be matched in characteristics within a predetermined design tolerance in order to achieve a certain circuit performance. One cell in such a pair is also called a "mirror" of the other cell. For example, mirror transistors are used in a bandgap voltage reference circuit. For another example, mirror resistors are used in a gain-boosted current mirror circuit. To increase productivity, modular design and cell replication techniques are frequently used. For example, one cell is first designed with various elementary circuit components interconnected. Then the cell is replicated and placed at a different location of the layout to be a mirror cell. For example, to obtain a high enough resistance, a plurality of poly resistors are interconnected in series to form a resistor unit, then the resistor unit is replicated thus to create a pair of matching resistors to be used in the IC devices. Frequently, due to variations of surrounding layout environment, such as pattern density, as well as variations in substrate uniformity, a cell and its mirror may exhibit difference in characteristics that is out of design tolerance.

Figure 3A:
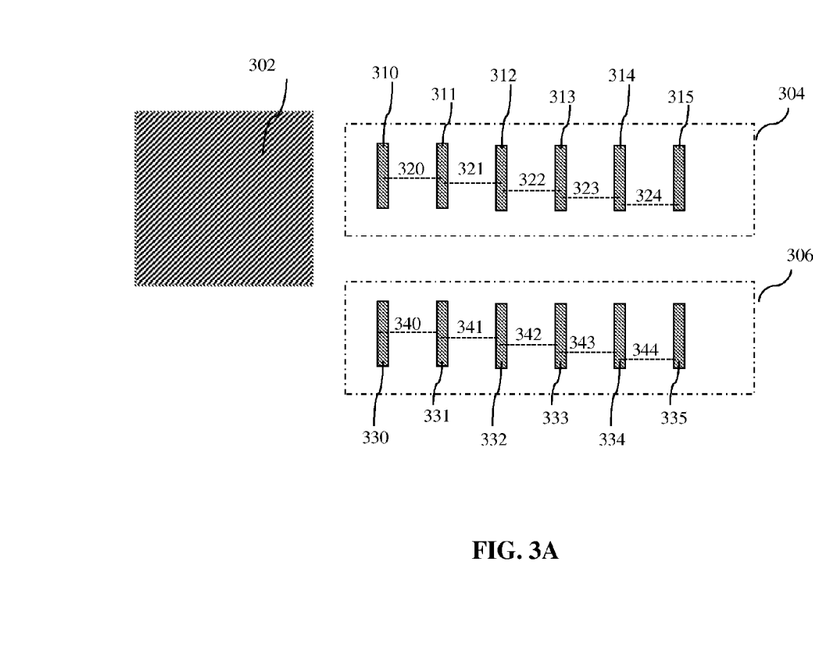
FIG. 3A is an IC design layout before mask fabrication according to various aspects of the present disclosure.
Figure 3B:
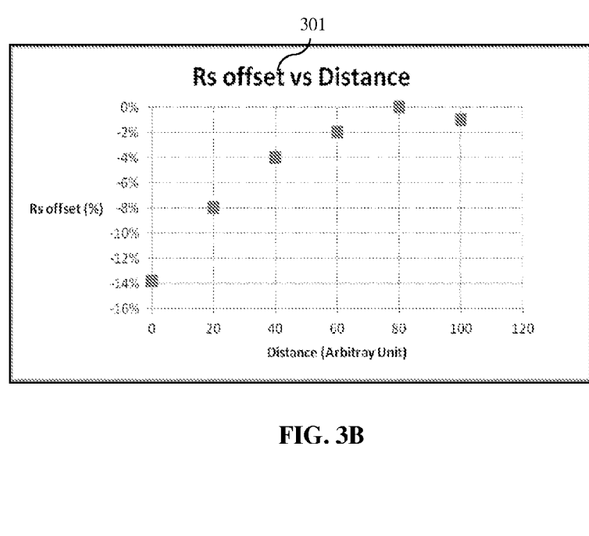
FIG. 3B is a chart showing resistance vs. distance.

FIGS. 3A and 3B illustrate such an example. Referring to FIG. 3A, cell 304 and cell 306 are two copies of the same cell where six segments of poly resistors are connected in series by routings to obtain high resistance. The routings may go through different layers of the IC layout and may include FEOL routings, BEOL routings, or combinations thereof. Cell 304 includes poly resistor segments 310, 311, 312, 313, 314, and 315 connected by routings 320, 321, 322, 323, and 324. Cell 306 includes poly resistor segments 330, 331, 332, 333, 344, and 335 connected by routings 340, 341, 342, 343, and 344. Cell 306 is intended to be used as a mirror resistor for cell 304. Also shown in the present example, a high density module 302 is located closer to cell 304 than to cell 306. Each poly resistor segment within cells 304 and 306 is affected by module 302 thereby its actual resistance may be different from its nominal resistance as a function of its distance from module 302, as illustrated in chart 301 (FIG. 3B). Consequently, the resistance of cell 304 does not match that of cell 306 and an offset between the two resistances may present an issue for the circuit performance and therefore may be addressed.

Referring again to FIG. 2A, a mirror router 214 is incorporated into the design flow. In the present embodiment, the mirror router 214 is a separate module interacting with the place-and-route module 202. In another embodiment, the mirror router 214 is a sub module residing within the place-and-route module 202.

The mirror router 214 includes multiple operations. Operation 214a identifies a cell and its mirror cell in the IC design layout. Operation 214b divides the cells into segments. In one embodiment, operation 214b includes removing existing routings within the cells. In another embodiment, operation 214b includes replacing a large component in the cells with a plurality of smaller components which collectively achieve substantially the same function as the large component. Operation 214c produces two new cells each of which includes a portion of segments from the cell and a portion of segments from the mirror cell. The segments within each new cell are connected by routings. Mirror router 214 may include criteria on whether to accept the two new cells. In one embodiment, such criteria include an electronic parameter measurement offset, such as resistance offset, between the two new cells being smaller than that between the cell and the mirror cell. Mirror router 214 may repeat the operations 214a, 214b, and 214c for each pair of mirror cells until desirable circuit matching results are obtained.

Figure 4:
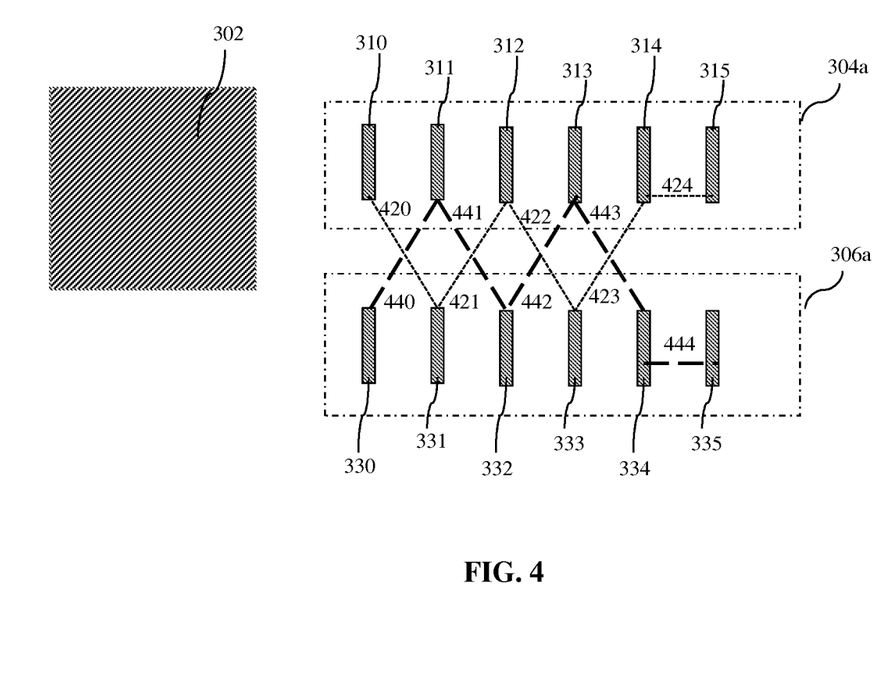
FIG. 4 is an example of an IC design layout after it has undergone a mixed routing according to various aspects of the present disclosure.
Figure 5:
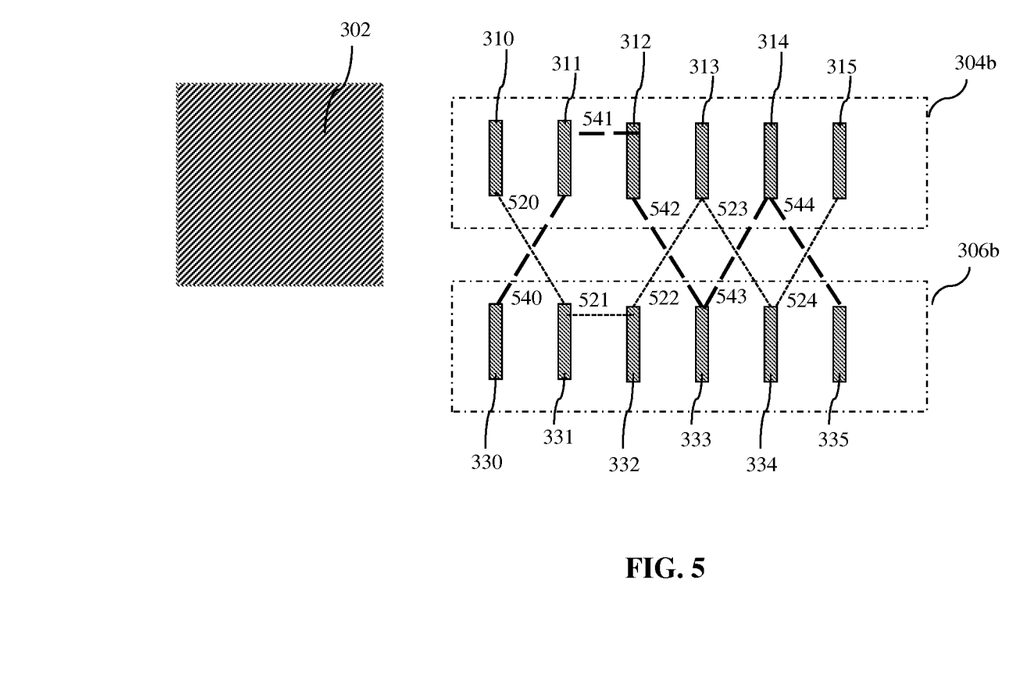
FIG. 5 is another example of an IC design layout after it has undergone a mixed routing according to various aspects of the present disclosure.

Referring now to FIG. 4. In the illustrated embodiment, having undergone the operations in mirror router 214, cells 304 and 306 have become cells 304a and 306a respectively. Cell 304a includes poly resistor segments 310, 331, 312, 333, 314, and 315 connected by routings 420, 421, 422, 423, and 424. Cell 306a includes poly resistor segments 330, 311, 332, 313, 334, and 335 connected by routings 440, 441, 442, 443 and 444. As a result, the offset between cell 304a and 306a, as measured by difference in resistance, is reduced. It is worth noting that selection of the segments in forming the new cells may take various combinations and the present disclosure is only one illustrative embodiment. FIG. 5 shows another embodiment according to the present disclosure. In this embodiment, having undergone the operations in mirror router 214, cells 304 and 306 have become cells 304b and 306b respectively. Cell 304b includes poly resistor segments 310, 331, 332, 313, 334, and 315 connected by routings 520, 521, 522, 523, and 524. Cell 306b includes poly resistor segments 330, 311, 312, 333, 314, and 335 connected by routings 540, 541, 542, 543 and 544.

Referring again to FIG. 2A, the physical design 108 also includes a simulation module 204. The simulation module 204 may include timing simulation for verifying signal path timing. The simulation module 204 may include physical simulation, such as SPICE simulation, for verifying output signal deformation, signal level, and time delay. After placement and routing are accomplished at step 202, a simplified resistance and capacitance (RC) extraction of the IC is performed for various aforementioned simulations. Routing and cell placement can be further optimized to improve simulation results. However, more detailed RC extraction of the IC is not available until the layout has been completed in the following steps.

The physical design 108 also includes layout/GDS module 206. After optimized placement and routing, the physical layout is created (in GDS format in one example) and finalized for further layout enhancement and sign-off verification. The physical design 108 also includes design rule check (DRC) and layout vs. schematic (LVS) module 208. DRC is performed on the physical layout to verify that the manufacturer concerned process requirements have been satisfied. LVS is performed such that the devices/interconnects are extracted to generate a netlist for comparison with an original design netlist defined at circuit design 106. This step is referred to as sign-off verification as well.

The physical design 108 also includes a RC parasitic extraction module 210. Electrical parameter extraction of the physical layout is performed after the sign-off verification 208 has been accomplished. Parasitic resistance and capacitance of the interconnection and the devices are extracted based on the layout to reflect real electric characteristics of various circuit elements.

More precise design analysis can be achieved in a back annotation module 212. The electrical parameters of all interconnect and devices are back-annotated into the simulation module 204 again to determine if further signal and/or physical timing deviation appear according to the layout and the parasitic effect. The layout will be further tuned if the signal timing is out of specification.

When both the sign-off verification 208 and simulation 204 indicate that the design layout is satisfactory, the physical design 108 proceeds to tape-out 220 to generate the data files for mask creation 110. In some scenarios, even after the IC devices 114 have been fabricated, design modifications may need to be performed, for example, to fix design issues or to enhance circuit performance. These scenarios are typically referred to as "respin" and are typically done by modifying few mask layers, instead of starting the circuit design all over. In such scenarios, the data file from the tape-out 220 is sent to the layout module 206 for the modifications and the modified design layout goes through the aforementioned verification process before being taped out again.

It is understood that the method of modifying a pair of mirror cells thereby to reduce offset between them, as illustrated in mirror router 214, is simply an example and in alternative embodiments, additional and/or different operations may be included in the method. Further, the disclosed method may be used to further tune the IC design layout after detailed RC extraction and back annotation have been performed.

Figure 2B:
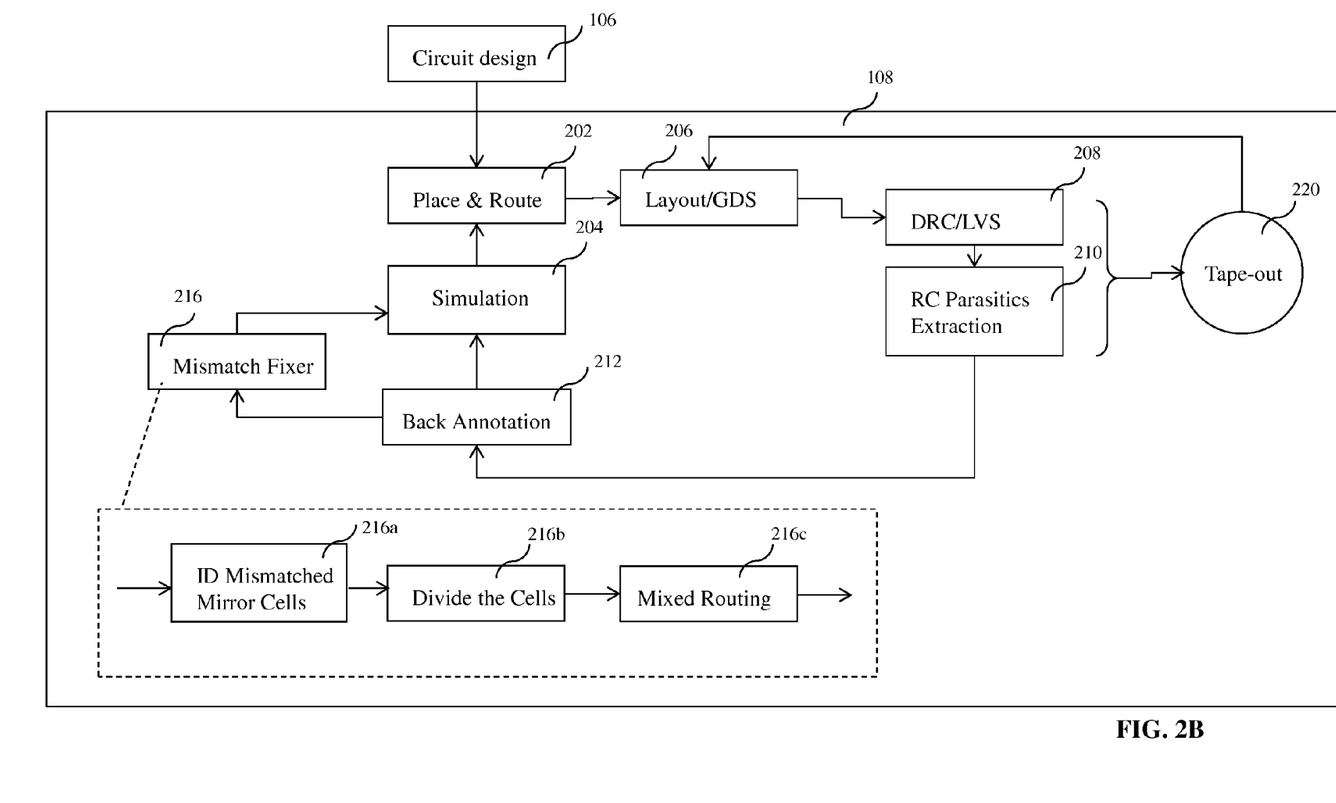
FIG. 2B is another embodiment of the IC physical design phase shown in FIG. 1 according to various aspects of the present disclosure.

FIG. 2B shows another embodiment of physical design 108 according to various aspects of the present disclosure. A mismatch fixer 216 is incorporated into the physical design 108 from the back annotation module 212 and the simulation module 204. The mismatch fixer 216 includes multiple operations. Operation 216a identifies a pair of mirror cells wherein an offset between them is greater than a predetermined value. In one embodiment, an offset is based on RC extraction of the IC design layout. Operation 216b divides each cell into segments. In one embodiment, operation 216b divides each cell into segments by removing existing routings within each cell. Operation 216c produces two new cells each of which includes a portion of segments from the cell and a portion of segments from the mirror cell. The segments within each new cell are connected by routings, such as FEOL routings, BEOL routings, or combinations thereof. Mismatch fixer 216 may include criteria on whether to accept the two new cells. In one embodiment, such criteria include an offset in certain circuit characteristics, such as resistance, between the two new cells being smaller than a predetermined value. Mismatch fixer 216 may repeat the operations 216a, 216b, and 216c for each pair of mirror cells until desirable circuit matching results are obtained. After mismatch fixer 216 has completed its operations, the IC design layout, as modified, is presented to simulation module 204 for detailed simulation and then goes through the rest of the physical design modules for sign-off.

Figure 6:
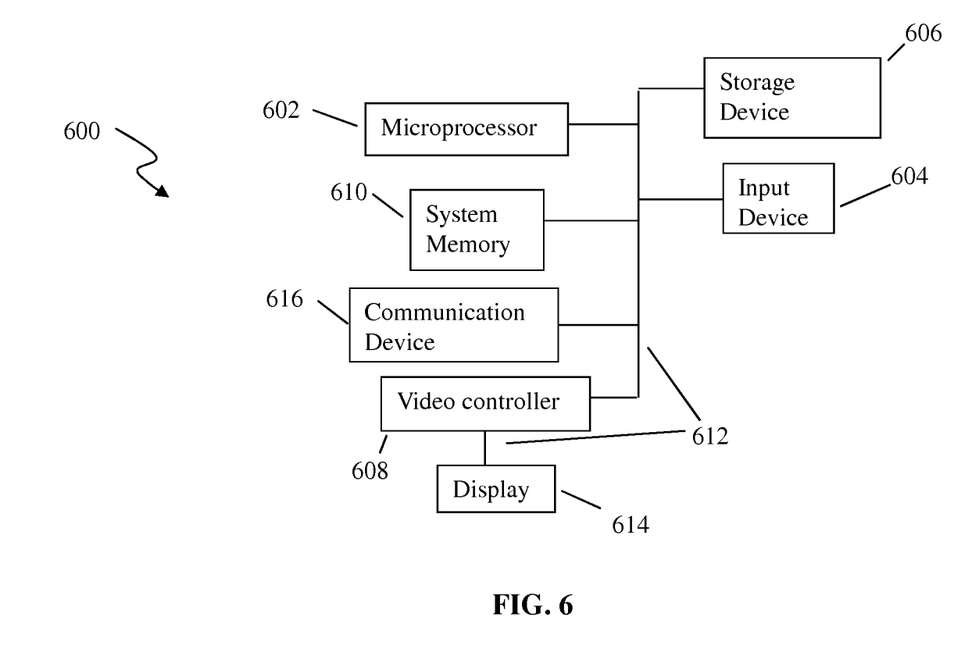
FIG. 6 is an illustration of a computer system for implementing one or more embodiments of the present disclosure.

Referring now to FIG. 6, shown therein is an illustrative computer system 600 for implementing embodiments of the methods described above. Computer system 600 includes a microprocessor 602, an input device 604, a storage device 606, a video controller 608, a system memory 610, a display 614, and a communication device 616 all interconnected by one or more buses 612. The storage device 606 could be a floppy drive, hard drive, CD-ROM, optical drive, or any other form of storage device. In addition, the storage device 606 may be capable of receiving a floppy disk, CD-ROM, DVD-ROM, or any other form of computer-readable medium that may contain computer-executable instructions. Further communication device 616 could be a modem, network card, or any other device to enable the computer system to communicate with other nodes. It is understood that any computer system could represent a plurality of interconnected (whether by intranet or Internet) computer systems, including without limitation, personal computers, mainframes, PDAs, and cell phones.

A computer system typically includes at least hardware capable of executing machine readable instructions, as well as the software for executing acts (typically machine-readable instructions) that produce a desired result. In addition, a computer system may include hybrids of hardware and software, as well as computer sub-systems.

Hardware generally includes at least processor-capable platforms, such as client-machines (also known as personal computers or servers), and hand-held processing devices (such as smart phones, personal digital assistants (PDAs), or personal computing devices (PCDs), for example). Further, hardware may include any physical device that is capable of storing machine-readable instructions, such as memory or other data storage devices. Other forms of hardware include hardware sub-systems, including transfer devices such as modems, modem cards, ports, and port cards, for example.

Software includes any machine code stored in any memory medium, such as RAM or ROM, and machine code stored on other devices (such as floppy disks, flash memory, or a CD ROM, for example). Software may include source or object code, for example. In addition, software encompasses any set of instructions capable of being executed in a client machine or server.

Combinations of software and hardware could also be used for providing enhanced functionality and performance for certain embodiments of the present disclosure. One example is to directly manufacture software functions into a silicon chip. Accordingly, it should be understood that combinations of hardware and software are also included within the definition of a computer system and are thus envisioned by the present disclosure as possible equivalent structures and equivalent methods.

Computer-readable mediums include passive data storage, such as a random access memory (RAM) as well as semi-permanent data storage such as a compact disk read only memory (CD-ROM). In addition, an embodiment of the present disclosure may be embodied in the RAM of a computer to transform a standard computer into a new specific computing machine.

Data structures are defined organizations of data that may enable an embodiment of the present disclosure. For example, a data structure may provide an organization of data, or an organization of executable code. Data signals could be carried across transmission mediums and store and transport various data structures, and, thus, may be used to transport an embodiment of the present disclosure.

The system may be designed to work on any specific architecture. For example, the system may be executed on a single computer, local area networks, client-server networks, wide area networks, internets, hand-held and other portable and wireless devices and networks.

A database may be any standard or proprietary database software, such as Oracle, Microsoft Access, SyBase, or DBase II, for example. The database may have fields, records, data, and other database elements that may be associated through database specific software. Additionally, data may be mapped. Mapping is the process of associating one data entry with another data entry. For example, the data contained in the location of a character file can be mapped to a field in a second table. The physical location of the database is not limiting, and the database may be distributed. For example, the database may exist remotely from the server, and run on a separate platform. Further, the database may be accessible across the Internet. Note that more than one database may be implemented.

Thus, the present disclosure provides one embodiment of a method of designing an integrated circuit (IC). The method includes providing a design layout of the IC; placing a first cell and a second cell into the design layout, wherein the second cell is a mirror of the first cell; dividing the first cell into a first plurality of segments; dividing the second cell into a second plurality of segments; forming a third cell by connecting a first portion of the first plurality of segments with a first portion of the second plurality of segments; and forming a fourth cell by connecting a second portion of the first plurality of segments with a second portion of the second plurality of segments, wherein the first, second, third and fourth cells each have substantially the same function.

The present disclosure provides another embodiment of a method of designing an integrated circuit (IC). The method includes providing a design layout of the IC; identifying a first cell and a second cell from the design layout, wherein the second cell is a mirror of the first cell and a first electronic parameter measurement offset between the first cell and the second cell is greater than a predetermined value; dividing the first cell into a first plurality of segments; dividing the second cell into a second plurality of segments; forming a third cell by connecting a first portion of the first plurality of segments with a first portion of the second plurality of segments; and forming a fourth cell by connecting a second portion of the first plurality of segments with a second portion of the second plurality of segments, wherein the first, second, third and fourth cells each have substantially the same function and a second electronic parameter measurement offset between the third cell and the fourth cell is smaller than the first electronic parameter measurement offset.

The present disclosure also provides one embodiment of an integrated circuit (IC) design system. The system includes a place-and-route module to generate an IC design layout; a resistance and capacitance (RC) extractor to extract RC based data from the IC design layout; a mismatch fixer module to identify and fix mismatched mirror cells; and a simulation module to perform simulation to the IC design layout.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of designing an integrated circuit (IC), the method comprising:
   placing a first cell and a second cell into a design layout of the IC, wherein the second cell is a mirror of the first cell, and wherein each of the first cell and the second cell contains a device selected from the group consisting of a resistor, a capacitor, and an inductor;

dividing the device of the first cell into a first plurality of segments;

dividing the device of the second cell into a second plurality of segments;

forming a third device of a third cell by connecting a first portion of the first plurality of segments with a first portion of the second plurality of segments; and forming a fourth device of a fourth cell by connecting a second portion of the first plurality of segments with a second portion of the second plurality of segments, and wherein at least one of: the dividing of the device of the first cell, the dividing of the device of the second cell, the forming of the third device, or the forming of the fourth device is performed by a computing system.

2. The method of claim 1, wherein an electronic parameter measurement offset between the third cell and the fourth cell is smaller than an electronic parameter measurement offset between the first cell and the second cell.

3. The method of claim 2, wherein the electronic parameter measurement offsets are based on: resistance, capacitance, inductance, or combinations thereof.

4. The method of claim 2, wherein the electronic parameter measurement offsets are one of:
a relative difference in value by two electronic parameter measurements; and
an absolute difference in value by two electronic parameter measurements.

5. The method of claim 1, wherein dividing the device of the first cell includes removing a portion of routings within the first cell and dividing the device of the second cell includes removing a portion of routings within the second cell.

6. The method of claim 1, wherein dividing the device of the first cell includes segmenting the device of the first cell into a plurality of equal parts and dividing the device of the second cell includes segmenting the device of the second cell into a plurality of equal parts.

7. The method of claim 1, wherein:
connecting the first portion of the first plurality of segments with the first portion of the second plurality of segments uses: front end of line (FEOL) routings, back end of line (BEOL) routings, or combinations thereof; and
connecting the second portion of the first plurality of segments with the second portion of the second plurality of segments uses: front end of line (FEOL) routings, back end of line (BEOL) routings, or combinations thereof.

8. A method of designing an integrated circuit (IC), the method comprising:
providing a design layout of the IC;
identifying a first cell and a second cell mirroring the first cell from the design layout, wherein a first electronic parameter measurement offset is between the first cell and the second cell, wherein the first cell includes a first resistor, and wherein the second cell includes a second resistor;
dividing the first resistor of the first cell into a first plurality of resistor segments;
dividing the second resistor of the second cell into a second plurality of resistor segments;
forming a third resistor of a third cell by connecting a first portion of the first plurality of resistor segments with a first portion of the second plurality of resistor segments; and
forming a fourth resistor of a fourth cell by connecting a second portion of the first plurality of resistor segments with a second portion of the second plurality of resistor segments;
wherein a second electronic parameter measurement offset between the third cell and the fourth cell is smaller than the first electronic parameter measurement offset, and
wherein at least one of: the identifying, the dividing of the first resistor, the dividing of the second resistor, the forming of the third resistor, or the forming of the fourth resistor is performed by a computing system.

9. The method of claim 8, wherein the providing of the design layout comprises:
performing circuit design; and
performing a place and route process.

10. The method of claim 8, wherein dividing the first resistor of the first cell includes removing at least a portion of routings within the first cell and dividing the second resistor of the second cell includes removing at least a portion of routings within the second cell.

11. The method of claim 8, wherein:
connecting the first portion of the first plurality of resistor segments with the first portion of the second plurality of resistor segments uses: front end of line (FEOL) routings, back end of line (BEOL) routings, or combinations thereof; and
connecting the second portion of the first plurality of resistor segments with the second portion of the second plurality of resistor segments uses: front end of line (FEOL) routings, back end of line (BEOL) routings, or combinations thereof.

12. The method of claim 8, wherein the electronic parameter measurement offsets are based on: resistance, capacitance, inductance, or combinations thereof.

13. The method of claim 8, further comprising:
determining whether the first electronic parameter measurement offset is greater than a predetermined value.

14. The method of claim 8, further comprising:
repeating the dividing and the forming operations until one of two conditions is met:
(1) a number of repetitions is greater than a predetermined value; and
(2) the second electronic parameter measurement offset is smaller than a predetermined value.

15. An integrated circuit (IC) design system comprising: a computing processor operable to a execute instructions
a place-and-route module to generate an IC design layout;
a resistance and capacitance (RC) extractor to extract RC based data from the IC design layout;
a mismatch fixer module to identify and fix mismatched mirror cells, wherein the mismatch fixer module is operable to:
identify a first device of a first cell and a second device of a second cell, wherein the first device and the second device are selected from the group consisting of: a resistor, an inductor, and a capacitor;
divide the first device into a first plurality of disconnected segments;
divide the second device into a second plurality of disconnected segments;
form a third device of a third cell from at least one segment of the first plurality of disconnected segments and at least one segment of the second plurality of disconnected segments; and
form a fourth device of a fourth cell from at least one segment of the first plurality of disconnected segments and at least one segment of the second plurality of disconnected segments; and a simulation module to perform simulation to the IC design layout.

16. The IC design system of claim 15, wherein the place-and-route module comprises a mirror router to route mirror cells.

17. The IC design system of claim 16,
wherein the first, second, third and fourth devices each have substantially the same function and an electronic parameter measurement offset between the third device and the fourth device is smaller than a predetermined value.

18. The IC design system of claim 15, wherein the mismatch fixer module is further operable to:
identify a first electronic parameter measurement offset between the first cell and the second cell being greater than a predetermined value
wherein the first, second, third and fourth devices each have substantially the same function and a second electronic parameter measurement offset between the third device and the fourth device is smaller than the first electronic parameter measurement offset.

19. The IC design system of claim 18, wherein the the mismatch fixer module uses: front end of line (FEOL) routings, back end of line (BEOL) routings, or combinations thereof.

20. The IC design system of claim 15, further comprising:
a design rule check (DRC) and logic vs. schematic (LVS) module;
a back annotation module; and
a layout/GDS module.

* * * * *